United States Patent [19]
Rabe et al.

[11] Patent Number: 5,212,826
[45] Date of Patent: May 18, 1993

[54] APPARATUS AND METHOD OF DC OFFSET CORRECTION FOR A RECEIVER

[75] Inventors: Duane C. Rabe, Rolling Meadows; Daniel C. Feldt, Streamwood, both of Ill.

[73] Assignee: Motorola, Inc., Schaumburg, Ill.

[21] Appl. No.: 630,644

[22] Filed: Dec. 20, 1990

[51] Int. Cl.$^5$ .............................................. H04B 1/16
[52] U.S. Cl. .................... 455/214; 455/312; 455/338
[58] Field of Search .......... 455/194.1, 200.1, 212–215, 455/220, 221, 225, 309, 311, 312, 303–305, 310, 338, 340, 341; 330/259, 270, 290; 375/84, 99, 102

[56] References Cited

U.S. PATENT DOCUMENTS

| | | | |
|---|---|---|---|
| 3,846,710 | 11/1974 | Chapman | 330/11 |
| 4,564,821 | 1/1986 | Reichart | 331/74 |
| 4,742,514 | 5/1988 | Goode et al. | 370/109 |
| 4,829,592 | 5/1989 | Wieschhoff et al. | 455/194 |
| 4,829,594 | 5/1989 | Heck et al. | 455/334 |
| 5,003,621 | 3/1991 | Gailus | 455/209 |

FOREIGN PATENT DOCUMENTS 0143028 7/1985 Japan .................................. 455/296

Primary Examiner—Reinhard J. Eisenzopf
Assistant Examiner—Chi H. Pham
Attorney, Agent, or Firm—Kirk W. Dailey; Rolland R. Hackbart; John A. Fisher

[57] ABSTRACT

The present disclosure includes a discussion of a radio receiver. The radio receiver has at least two operational states and includes a variable gain amplifier and at least two adaptive DC offset compensators (421, 427) to suppress undesired DC offset. The first operational state of the radio receiver (121) adjusts the adaptive DC offset compensator circuits (421, 427) to appropriate output levels in absence of an input signal to the radio (121). The second operational state receives the input signal through the radio receiver (121) and eliminates the undesired DC offset (309) from the received input signal with the adaptive DC offset compensator circuits (421, 427) and allows the received input signals to be processed.

17 Claims, 3 Drawing Sheets

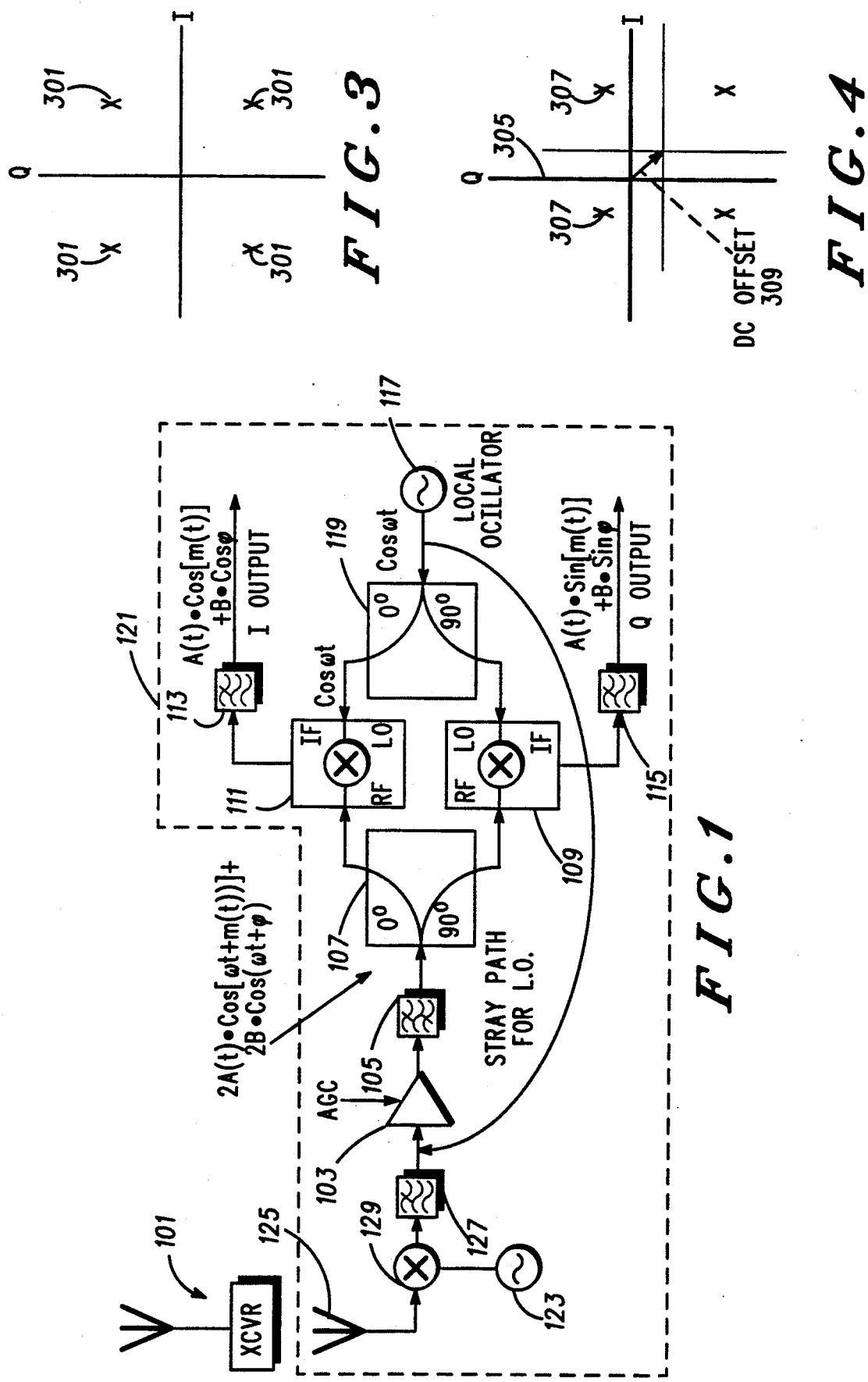

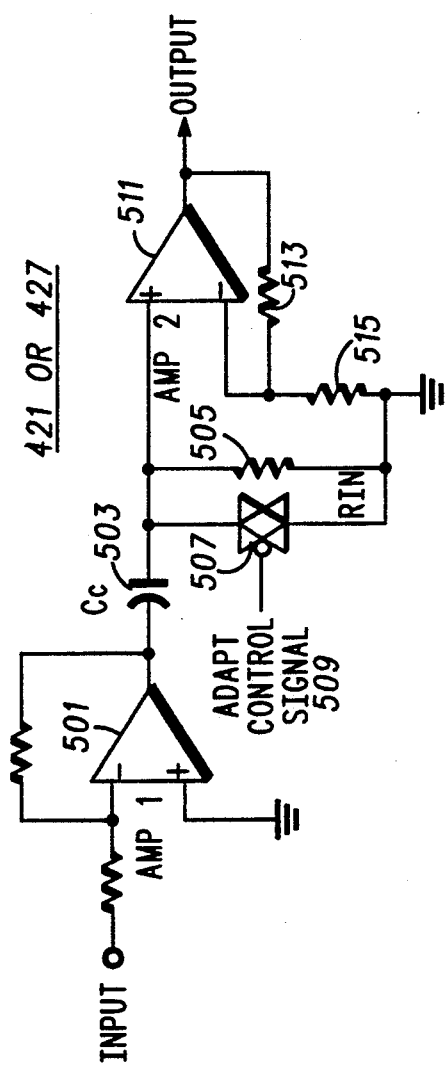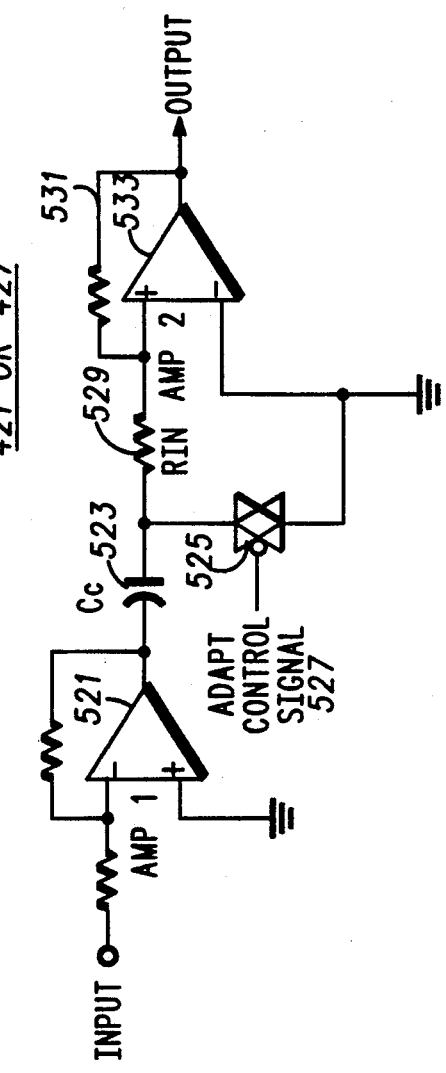

APPARATUS AND METHOD OF DC OFFSET CORRECTION FOR A RECEIVER

FIELD OF THE INVENTION

This invention generally relates to amplifiers contained within a receiver and more specifically to diminishing DC offset of input signals in a radio receiver.

BACKGROUND OF THE INVENTION

In a typical radio receiver, an antenna receives radio frequency signals and converts them into electrical radio frequency signals. These radio frequency signals are then reduced to a lower frequency signal for amplification in an intermediate frequency (IF) stage. The intermediate frequency stage can be seen in FIG. 1. In the intermediate frequency stage the signal received from the antenna is amplified and bandpass filtered. Then the signal is split and input to a quadrature demodulator. The demodulator reduces the frequency of the signal to the base band frequency and prepares the signals for extraction of the useful information. The base band circuitry filters, amplifies and processes the signal extracting the analog or digital data.

A first source of distortion in the base band frequency signal is common to a majority of such radio receivers. The distortion is the result of extraneous noise coupled into the receiver circuitry causing inaccuracies in the resulting data. Some of the extraneous noise is the result of the local oscillators being coupled into the amplifier stages with an unknown phase shift. This results in an undesired DC component in the resulting demodulated base band frequency signal.

A second source of distortion in the base band frequency signal occurs when there is a change in the received signal strength. This can occur when a receiver changes from one frequency to another or when the source of the received signal changes. The relationship between the two signal strengths results in a change of the gain requirements of the automatic gain controller AGC 103 located at the beginning of the intermediate frequency stage shown in FIG. 1. This change in gain changes the resulting DC component of the base band frequency signal.

Other sources of distortion in the base band frequency signal are a result of imperfect amplifying stages and demodulator circuitry.

The results of these added undesired DC components to signals used for digital data transmission are illustrated in FIG. 3 and FIG. 4. FIG. 3 shows an ideal representation of an arbitrary signal set, represented in signal space by the Xs 301 projected onto the inphase (I) and quadrature (Q) axes 303. In FIG. 4, the results of adding an undesired DC offset 309 to either the I or the Q component is illustrated. The shifts in the I and Q components cause the decision threshold to shift, thus, biasing the selection of one symbol over the other, reducing the noise margin for some of the symbols and allowing a reduced margin for error in the presence of uncorrelated noise.

The undesired DC offset error introduced from the local oscillator is often acceptable for some radio receivers, however, digital radio receivers have a lower tolerance to offset errors than a conventional analog radio receiver. The undesired DC offset introduced from changing signal strengths is usually never a problem in a single frequency radio receiver, however, in tunable radio receivers it can be a problem. The problem is transitory in nature and occurs upon tuning the radio receiver to a new frequency. This may be acceptable for some applications and many conventional radios use resistor (R) capacitor (C) networks and others have added a switch to change the impedance of the RC network during a transition to reduce the amount of time for the transition to settle. The straightforward solution of an RC network to remove the undesired DC component, better known as AC coupling, becomes biased when a long sequence of symbols, representing patterns of 1s and 0s, received by a digital receiver do not have an equal number of 1s and 0s, therefore, causing a desired DC component which would be eliminated by AC coupling the signal. There exists a need for a device to correct for the undesired DC offset quickly prior to receiving the data of interest on the radio receiver. Such a device should correct for transient errors that occur when tuning to a new frequency and would quickly adapt to the correct voltage level. There exists a need to correct in an extremely short time for the undesired DC offset caused from changing the receiver gain and coupling of the local oscillator in the IF stage.

SUMMARY OF THE INVENTION

The present invention encompasses a radio receiver which receives an input signal and includes at least two operational states, base band (BB) circuitry and at least two adaptive DC offset compensators in the BB circuitry. When the first operational state of the radio receiver is activated, the DC offset compensator circuits are adjusted to a predetermined output level in absence of an input signal to the radio receiver. When the second operational state is activated, the received input signal is passed by the radio receiver and the DC offset is diminished from the received input signal with the adaptive DC offset compensator circuits in the BB circuitry.

BRIEF DESCRIPTION OF THE DRAWINGS

FIG. 1 is a diagram of a radio frequency transmission system including limited detail of the receiver.

FIG. 3 is a picture of ideal arbitrary signals transposed onto the inphase and quadrature axes.

FIG. 4 is a picture of arbitrary signals containing an undesired DC offset and transposed onto the inphase and quadrature axes.

FIG. 6 is a diagram of an adaptive DC offset compensator circuit useful in the circuit of FIG. 4.

FIG. 7 is a diagram of an alternative adaptive DC offset compensator circuit.

DESCRIPTION OF A PREFERRED EMBODIMENT

Figure 5:
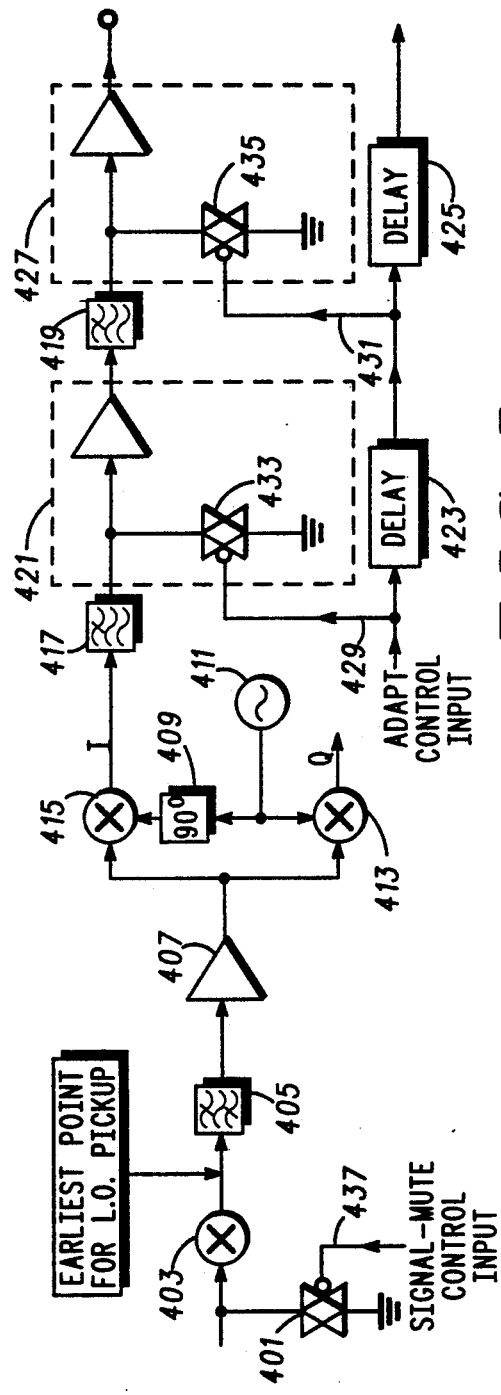
FIG. 5 is a diagram of a base band circuit which may employ the present invention.

This preferred embodiment encompasses a radio frequency system conveying radio frequency signals between a transmitter 101 and a receiver 121. The transmitter 101 is a fixed site transmitter serving a radio coverage area populated by mobile and portable receivers, the receiver 121 of which is shown in FIG. 1.

The antenna 125 transduces the radio frequency signals into electronic radio frequency (RF) signals. Mixer 129 mixes the local oscillator frequency 123 with the incoming radio frequency signals reducing the frequency data to an intermediate frequency (IF). After passing the IF signals through an additional filter 127, the automatic gain control (AGC) amplifier 103 amplifies the signals to the correct voltage levels to avoid saturation and to be interpreted by the remaining circuitry in the receiver 121. The AGC is a variable gain amplifier controlled by the measured power of the incoming radio frequency signals. The received IF signals are then bandpass filtered 105 and input into the quadrature demodulating circuit.

The quadrature demodulator circuit is made up of a splitter 107, two mixers 109, 111, a power splitter 119 and a local oscillator 117. The combination of the local oscillator 117 and the power splitter 119 produces two signals 90 degrees out of phase with each other. The two signals are referred to as inphase (I) and quadrature (Q) signals. The received IF signals are split and identical information sent to the two mixers 109, 111. The mixer 111 mixes the received IF signals with the inphase (I) component of the local oscillator signal 117. The signal is then low pass filtered 113 resulting in an inphase (I) data signal. The mixer 109 mixes the received IF signals with the quadrature (Q) component of the local oscillator signal 117. The result of this mixer is then low pass filtered 115 resulting in a quadrature (Q) data output. The resulting I and Q data are considered base band signals and are then interpreted by the base band circuitry to form digital data to be used by the radio telephone system.

Figure 2:
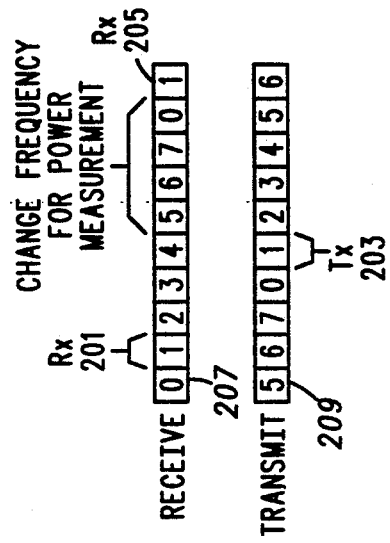
FIG. 2 is a diagram of a timeslot configuration used in a time division multiple access (TDMA) transmission system.

The radio receiver 121 is designed for use in a European digital radio telephone system as specified by the Group Special Mobile (GSM) committee, the radiotelephone system transmits and receives time division multiple access data. In a TDMA system the radiotelephone only sends data to and receives data from the fixed site transceiver 101 in certain time slots. An example of a TDMA transmit and receive scheme is shown in FIG. 2. This particular radio has been assigned time slot 1 to transmit and receive data. The transmit time slots 209 and the receive time slots 207 are skewed in time by three time slots to allow use of the same antenna to transmit and receive at different times. In between transmitting and receiving during time slots 6, 7, and 0 the radiotelephone receiver changes frequencies and does a power measurement, checking the signal strength, of an adjacent base station. Since the repetition of the received time slots 201, 205 occurs only 4.615 milliseconds apart and since during time slots 6, 7, and 0 the radio receiver 121 must change frequency and gain, a burden is placed on the receiver circuitry to quickly adjust to the correct DC bias voltage to avoid distorting the received data.

In FIG. 3 and FIG. 4, as previously explained, the effect of an undesired DC offset 309 voltage can be seen on the decision threshold which determines the signal symbols. The circuitry, as shown in FIG. 5, eliminates the DC offset problem. The circuitry contains two separate operational states. The first operational state occurs prior to receiving valid data and the second operational state occurs while receiving valid data.

During this first operational state, the automatic gain control amplifier 407 is set to a predetermined level which has been determined in previous power measurements of the given frequency. The receiver is muted at 401 blocking any radio frequency signals from being received into the mixer 403. The muting ideally allows the base band circuitry to adjust to the desired DC levels of the I and Q signals. The IF signals are filtered at 405 and then amplified at 407. The IF signals are input into the demodulators 415, 413. The I and Q data signals are output. To avoid repetition only the I circuits are shown from this point because the I and Q circuits are identical. The I data signals are then low pass filtered 417. These signals are then input into the adaptive DC offset compensator circuit 421 which corrects the bias voltage of the received signal such that the resultant which is input into the low pass filter 419 settles to the desired reference voltage. After a delay in time determined by 423, the adaptive DC offset compensator circuit 427 similar to the previous adaptive DC offset compensator circuit 421 is switched on. This circuit removes any additional DC offset created or passed by the previous adaptive DC offset compensator circuit 421. The resulting signal is an I data signal which is properly adjusted to remove any residual undesired DC offset 309. These adaptive DC compensator circuits 421, 427 are further explained in FIGS. 6, 7 and 8.

FIG. 6 shows a detailed view of an implementation of the adaptive DC offset compensator circuits 421 and 427 in conjunction with a non-inverting amplifier. After the input signal has been muted and the AGC voltage is set to the predetermined level, the adapt control signal 509 activates the switch 507 which changes the resistance between the signal path and electrical ground from resistor Rin 505 to the internal resistance of the switch 507 allowing the capacitor Cc 503 to charge rapidly, thus, allowing the output of the inverting amplifier 511 to settle to the desired reference voltage very quickly. After that time, the switch 507 is opened and the time constant formed by resistor Rin 505 and capacitor Cc 503 is set to the appropriate low frequency cutoff and ready to remove the undesired DC offset from the I data signal during the second operational state.

Alternatively, the adaptive DC offset compensator circuit which is adapted to inverting amplifiers is shown in FIG. 7. Here, when the switch 525 is activated the capacitor Cc 523 is charged rapidly, thus, allowing the output of the inverting amplifier 533 to settle to the desired reference voltage very quickly. After that time, the switch 525 is opened and the time constant formed by resistor Rin 529 and capacitor Cc 523 is set to the appropriate low frequency cutoff and ready to remove the undesired DC offset 309 from the I data signal during the second operational state.

Figure 8:
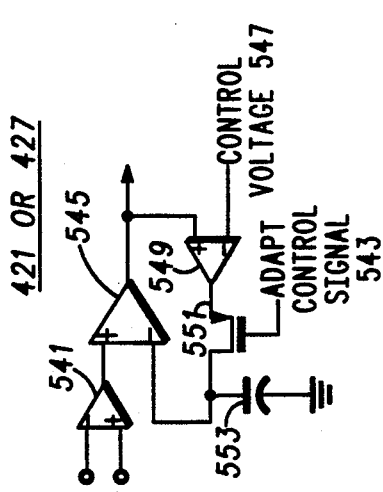
FIG. 8 is a diagram of a second alternative adaptive DC offset compensator circuit.

Another alternative embodiment for the adaptive DC offset compensator circuit which is optimized for implementation in an integrated circuit (IC) is illustrated in FIG. 8. Here, the adaptive DC offset compensator circuit comprises a feedback loop on an amplifier 545. The feed back loop uses the output of the amplifier as a positive input to a transadmittance amplifier 549. The negative input of the transadmittance amplifier is a reference control voltage 547. The output of the transadmittance amplifier 549 is connected to one end of a switch 551, the other end of the switch 551 is connected to the negative input of the amplifier 545 across a capacitor 553.

When the switch 551 is closed the transadmittance amplifier 549 can source or sink current across the capacitor 553 adjusting the DC voltage on the negative input of the amplifier. The DC voltage is adjusted to a level causing the voltage level on the output of the amplifier 545 to adjust to the appropriate voltage level.

After the voltage is properly adjusted, the switch 551 is opened. While the switch 551 is opened, the voltage across the capacitor 553 is held at the final level determined when the switch 551 was closed. The voltage across the capacitor 553 will be held at this voltage level until the switch 551 is closed.

After the process of adjusting all of the adaptable amplifier circuits, the radio receiver 121 is prepared to receive radio frequency signals from the transmitter 101.

The second operational state removes the radio frequency (RF) mute 401 and allows the RF signals into the radio receiver 121 signal path. During this time, the switches contained in the adaptive DC offset compensator circuits 421, 427 remain open and remove the undesired DC offset 309, allowing the digital data to be recovered and processed by the radiotelephone.

This embodiment is capable of removing undesired DC offset from the BB frequency signals without regard to the source of the distortion. A person with average skill in the art could apply the invention disclosed herein to similar embodiments not limited to the following: radio receivers which convert the receive input signal directly to the base band frequency or radio receivers which contain some variable gain in the base band circuitry.

What is claimed is:

1. A radio receiver for receiving an input signal and including base band (BB) circuitry and at least a first and a second operational state, the input signal having an undesired DC offset, the radio receiver comprises:
   means for receiving the input signal during the second operational state, forming a received input signal;
   a first and a second adaptive DC offset compensator circuit coupled to said means for receiving and disposed in the BB circuitry comprising means for diminishing the undesired DC offset from the received input signal during said second operational state;
   a first and second means for adjusting each of said first and said second adaptive DC offset compensator circuits to a predetermined output level during the first operational state; and
   means for delaying in time operation of said second means for adjusting from said first means for adjusting.

2. A radio receiver in accordance with claim 1 wherein the radio receiver is a quadrature demodulating time division multiple access (TDMA) radio receiver.

3. A radio receiver in accordance with claim 1 wherein said means for receiving during the second operational state further comprises means for muting said input signal from the radio receiver during the first operational state.

4. A radio receiver in accordance with claim 1 wherein said means for adjusting each one of said first and second adaptive DC offset compensator circuits further comprises means, responsive to asserting a control signal during said first operational state, for changing a charge on a capacitor disposed within a filter.

5. A radio receiver in accordance with claim 4 wherein said means for diminishing further comprises means, responsive to de-asserting said control signal during said first operational state, for adjusting the cut-off frequency of said filter.

6. A radio receiver in accordance with claim 1 wherein said means for adjusting further comprises means, responsive to asserting a control signal, for adjusting an input voltage of an amplifier, said amplifier disposed within said adaptive DC offset compensator circuits.

7. A radio receiver in accordance with claim 5 wherein said means for diminishing further comprises means, responsive to de-asserting said control signal, for maintaining said input voltage of said amplifier.

8. A radio receiver which receives an input signal and includes base band (BB) circuitry, the input signal having an undesired DC offset, the radio receiver comprising:
   a first and a second operational state; means for passing the input signal through the radio receiver during the second operational state, forming a received input signal;
   at least a first and a second adaptive DC offset compensator circuits disposed in a first and a second section of the BB circuitry respectively, said first section of BB circuitry passing said received input signal prior to said second section passing said received input signal, said first and said second adaptive DC offset compensator circuits comprising means for diminishing the undesired DC offset from said received input signal during said second operational state:
   means, responsive to a first control signal, for adjusting said first adaptive DC offset compensator circuit to a first predetermined output level during said first operational state; and
   means, responsive to a second control signal, for adjusting said second adaptive DC offset compensator circuit to a second predetermined output level during said first operational state, said second control signal delayed in time from said first control signal.

9. A radio receiver in accordance with claim 8 wherein the radio receiver is a quadrature demodulating time division multiple access (TDMA) radio receiver.

10. A radio receiver in accordance with claim 8 wherein during said first operational state the radio receiver further comprises means, for muting said input signal from the BB circuitry.

11. A radio receiver in accordance with claim 8 wherein said means for adjusting said at least first and said second adaptive DC offset compensator circuits further comprises a filter including at least one capacitor and a switch, where said at least one capacitor is disposed serially within a path of said received input signal, a first end of said switch coupled to said path of said received signal and a second end of said switch coupled to an electrical ground, such that when said switch is closed, in response to an asserted control signal, any DC voltage present at said at least one capacitor will cause said at least one capacitor to charge rapidly.

12. A radio receiver in accordance with claim 11 wherein said means for diminishing the undesired DC offset from said received input signal further comprises a filter including said at least one capacitor, at least one resistor and said switch, a first end of said at least one resistor is coupled to said path of said received input signal, a second end of said at least one resistor is coupled to said electrical ground, such that when said switch is open, in response to a de-asserted control signal, a cut-off frequency is formed by said at least one resistor and said at least one capacitor's inherent time constant.

13. A radio receiver in accordance with claim 11 wherein said means for diminishing the undesired DC offset from said received input signal further comprises a filter including said at least one capacitor, at least one resistor and said switch, where said at least one resistor is disposed serially within said path of said received input signal, such that when said switch is open, in response to a de-asserted control signal, a cut-off frequency is formed by said at least one resistor and said at least one capacitor's inherent time constant.

14. A radio receiver in accordance with claim 8 wherein said means for adjusting said at least first and said second adaptive DC offset compensator circuit further comprises at least one transadmittance amplifier, at least one capacitor and a switch, where an output of said at least one transadmittance amplifier is coupled to a first end of said switch, a second end of said switch is coupled to a first end of said at least one capacitor and a second end of said at least one capacitor coupled to an electrical ground, such that when said switch is closed, in response to an asserted control signal, said at least one capacitor is charged to a desired voltage level.

15. A radio receiver in accordance with claim 14 wherein said means for diminishing the undesired DC offset from said received input signal further comprises:

an amplifier disposed within the BB circuitry, amplifying said received input signal; and
a feedback loop of said amplifier including said at least one transadmittance amplifier, said at least one capacitor and said switch, wherein said output of said at least one transadmittance amplifier is coupled to an input of said amplifier and an input of said transadmittance amplifier is coupled to an output of said amplifier, such that when said switch is open, in response to a de-asserted control signal, said at least one capacitor maintains said desired voltage level at said input of said amplifier.

16. A method of diminishing the undesired DC offset of a received input signal in a time division multiplexed radio including at least two adaptive DC offset compensator circuits, the method comprising the steps of:
muting said input from the radio receiver for a first predetermined period;
adjusting said at least two adaptive DC offset compensator circuits to a predetermined output level, during said first predetermined period;
receiving the input signal during a second predetermined period, forming the received input signal;
diminishing the DC offset from said received input signal during said second predetermined period.

17. A method of diminishing the DC offset of a received input signal in accordance with claim 16 wherein said step of adjusting further comprises the step of forming a cut-off frequency of a filter, such that the undesired DC offset is diminished when said received input signal is input to said filter.

* * * * *

UNITED STATES PATENT AND TRADEMARK OFFICE
CERTIFICATE OF CORRECTION

PATENT NO. : 5,212,826

DATED : May 18, 1993

INVENTOR(S) : Duane C. Rabe et al.

It is certified that error appears in the above-identified patent and that said Letters Patent is hereby corrected as shown below:

Col. 6, line 9, "5" should be --6--.

Col. 8, line 17, "input from" should be --input signal from--.

Signed and Sealed this

First Day of March, 1994

*Attest::*

BRUCE LEHMAN

*Attesting Officer*     *Commissioner of Patents and Trademarks*